United States Patent
Chi et al.

(10) Patent No.: US 9,793,901 B2
(45) Date of Patent: Oct. 17, 2017

(54) INTEGRATED CIRCUIT

(71) Applicant: SK hynix Inc., Gyeonggi-do (KR)

(72) Inventors: Han-Kyu Chi, Gyeonggi-do (KR);
Kyung-Hoon Kim, Gyeonggi-do (KR);
Myeong-Jae Park, Gyeonggi-do (KR);
Taek-Sang Song, Gyeonggi-do (KR);
Tae-Wook Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/994,291

(22) Filed: Jan. 13, 2016

(65) Prior Publication Data

US 2017/0063384 A1 Mar. 2, 2017

(30) Foreign Application Priority Data

Sep. 2, 2015 (KR) .................. 10-2015-0124189

(51) Int. Cl.
| | |
|---|---|
| H04L 7/00 | (2006.01) |
| H03L 7/08 | (2006.01) |
| H03K 5/135 | (2006.01) |
| H03L 7/10 | (2006.01) |
| H04L 7/033 | (2006.01) |
| H03K 5/00 | (2006.01) |

(52) U.S. Cl.
CPC ........... *H03L 7/0807* (2013.01); *H03K 5/135* (2013.01); *H03L 7/105* (2013.01); *H04L 7/0037* (2013.01); *H04L 7/0331* (2013.01); *H03K 2005/00019* (2013.01)

(58) Field of Classification Search
CPC ............................ H04L 7/0008; H04L 7/0079
See application file for complete search history.

(56) References Cited

U.S. PATENT DOCUMENTS

| | | | | |
|---|---|---|---|---|
| 2008/0297216 | A1* | 12/2008 | Chiang | G01R 31/3016 327/158 |
| 2010/0271092 | A1* | 10/2010 | Zerbe | G06F 13/4243 327/161 |
| 2013/0249717 | A1* | 9/2013 | Johnson | H03K 5/135 341/100 |

FOREIGN PATENT DOCUMENTS

KR   100498229   7/2005

* cited by examiner

*Primary Examiner* — Shuwang Liu
*Assistant Examiner* — Gina McKie
(74) *Attorney, Agent, or Firm* — IP & T Group LLP (57) ABSTRACT

An integrated circuit may include: a phase detector suitable for generating a delay control signal by comparing the phases of first and second clock signals to first and second target positions, a variable delay unit suitable for shifting the first and second clock signals to the first and second target positions, respectively, in response to the delay control signal, and a position controller suitable for varying the first and second target positions according to an operation mode.

10 Claims, 8 Drawing Sheets

INTEGRATED CIRCUIT

CROSS-REFERENCE TO RELATED APPLICATIONS

The present application claims priority of Korean Patent Application No. 10-201.5-0124189, filed on Sep. 2, 2015, which is incorporated herein by reference in its entirety.

BACKGROUND

1. Field

Exemplary embodiments of the present invention relate generally to a semiconductor design technology and more particularly to an integrated circuit including a phase detector.

2. Description of the Related Art

Generally, a semiconductor device including a DDR SDRAM (Double Data Rate Synchronous DRAM) may receive a clock signal from an external device and may convert the received clock signal into an internal clock signal suitable using a clock generation circuit. The internal clock signal may then be sued by internal circuits to perform a variety of operations. Representative examples of well-known clock generation circuits include a delay locked loop (DLL) clock generation circuit and a phase locked loop (PLL) clock generation circuit.

The PLL and the DLL clock generation circuits may generally have similar configurations and may both include a phase detector. However, PLL clock generation circuits employ a voltage controlled oscillator (VCO) to generate an internal clock signal, whereas DLL clock generation circuits employ a voltage controlled delay line (VCDL).

Recently, semiconductor devices may also include a clock data recovery (CDR) circuit for recovering data and clock signals using data inputted from an external device. Briefly, a CDR circuit may receive high-speed data, detect a clock signal component within the data, recover an internal clock signal from the detected clock signal component, and recover actual data according to the recovered internal clock signal. Existing CDR circuits have a similar configuration to PLL clock generation circuits for recovering a clock signal. Generally, a CDR circuit may recover an internal clock signal and align the phase of the recovered internal clock signal with the center of the data. A phase detector may detect whether the phase of the internal clock signal is aligned with the center of the data. According to the detection result, the phase detector may generate a control signal for performing a phase shifting operation commonly referred to as a down or an up operation depending on whether a phase is advanced or delayed. Conventional phase shifting operations will now be described with reference to FIGS. 1 and 2.

Figure 1:
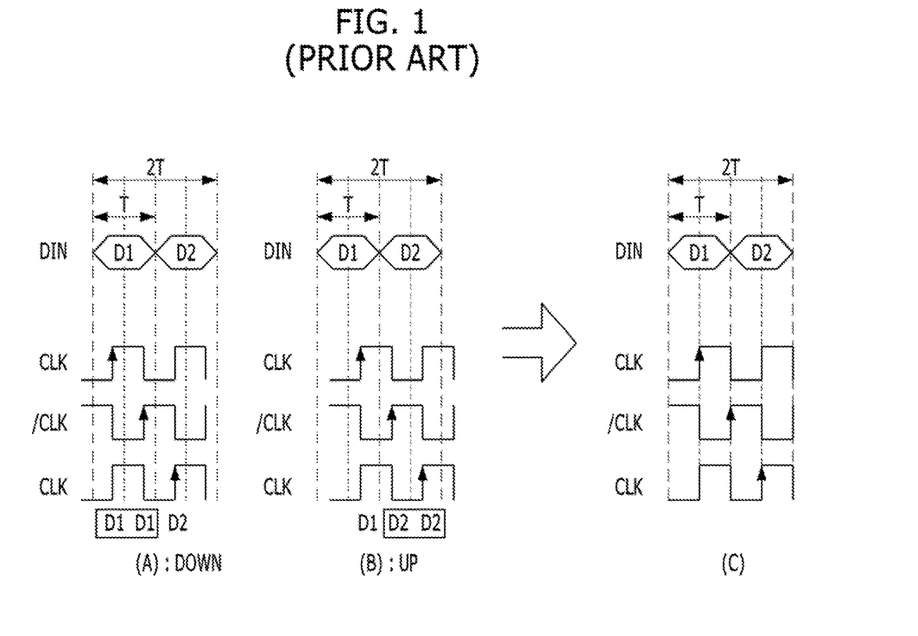
FIG. 1 is a diagram illustrating conventional phase shifting operations.

FIG. 1 is a diagram illustrating the operation of a phase detector included in a conventional CDR circuit.

Referring to FIG. 1, three cases are illustrated denoted generally with reference symbols (A), (B) and (C). In case (A) a clock signal CLK may lead the center of data DIN In case B) a dock signal CLK may lag behind the center of the data DIN. In case (C) a dock signal CLK, and a clock bar signal /CLK having a 180 degree phase difference with the clock signal CLK, are phase-shifted through a down operation based on case (A) or an up operation based on case (B).

In case (A), data D1 may be synchronized with a first rising edge of the clock signal CLK and with a rising edge of the clock bar signal /CLK, and data D2 may be synchronized with a second rising edge of the clock signal CLK. For example, the data D1, D1, and D2 may be synchronized in response to the clock signal CLK and the clock bar signal /CLK, and the phase detector may generate a control signal for a down operation. The CDR circuit may perform the down operation to delay the clock signal CLK and the clock bar signal /CLK. Hence the clock signal CLK and the clock bar signal /CLK may have phases as illustrated in case (C).

In case (B), the data D1 may be synchronized with the first rising edge of the clock signal CLK. The data D2 may be synchronized with the rising edge of the clock bar signal /CLK and the second rising edge of the clock signal CLK. For example, the data D1, D2 and D2 may be synchronized in response to the clock signal CLK and the clock bar signal /CLK, and the phase detector may generate a control signal for an up operation. The CDR circuit may perform an up operation to advance the clock signal CLK and the clock bar signal /CLK. Hence, the dock signal CLK and the clock bar signal /CLK may have phases as illustrated in case (C).

In case (C), the rising edge of the clock signal CLK may be positioned at the center of the data DIN, and the rising edge of the clock bar signal /CLK may be positioned at the edge of the data DIN. Thus, when the DIN is sampled by the dock signal CLK, the data may be recovered.

The data DIN may have a phase difference of one half of a cycle T of the clock signal CLK. For example, the phase difference between the data DIN and the clock signal CLK may be ½T.

Figure 2:
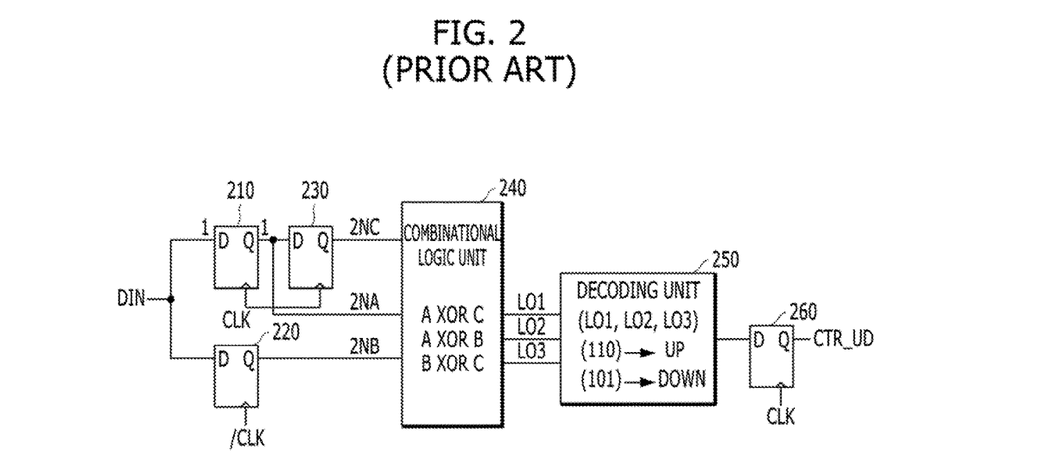
FIG. 2 is a block diagram illustrating a conventional phase detector.

FIG. 2 is a block diagram illustrating a conventional phase detector for performing the operations of FIG. 1.

Referring to FIG. 2, a conventional phase detector may include first to third synchronization units 210 to 230, a combinational logic unit 240, a decoding unit 250, and a fourth synchronization unit 260.

The first synchronization unit 210 may synchronize the data DIN with the clock signal CLK and output the synchronized data as a first synchronized signal 2NA. The second synchronization unit 220 may synchronize the data DIN with the clock bar signal /CLK and output the synchronized data as a second synchronized signal 2NB. The third synchronization unit 230 may synchronize the first synchronized signal 2NA with the clock signal CLK and output the synchronized signal as a third synchronized signal 2NC.

The combinational logic unit 240 may perform a logical operation on the first synchronized signal 2NA, the second synchronized signal 2NB, and the third synchronized signal 2NC to output first to third logic values LO1 to LO3. An external device, the combinational logic unit 240 may include a plurality of XOR gates XOR. When the first synchronized signal 2NA is replaced with A, the second synchronized signal 2NB is replaced with B, and the third synchronized signal 2NC is replaced with C, the first logic value LO1 may correspond to A XOR C, the second logic value LO2 may correspond to A XOR B and the third logic value LO3 may correspond to B XOR C.

The decoding unit 250 may generate a source signal of an up or down control signal CTR_UD by decoding the first to third logic values LO1 to LO3. For example, we consider a case where the data D1 of the data DIN is logic high, and the data D2 is logic low. Then, the decoding unit 250 may generate the source of the up or down control signal CTR_LID for the up operation when the first and second logic values LO1, LO2 are logic high, and the third logic value LO3 is logic low. The decoding unit 250 may generate the source signal of the up or down control signal CTR_UD for the down operation when the first and third logic values LO1, LO3 are logic high and the second logic value LO2 is logic low.

The fourth synchronization unit 260 may synchronize the output signal of the decoding unit 250 with the clock signal CLK, and output the synchronized signal as the up or down control signal CTR_UD.

The dock signal CLK and the clock bar signal /CLK may be filially shifted to the positions as illustrated in case (C) of FIG. 1, via the up or down operation performed in response to the up or down control signal CTR_UD. Hence, the data DIN may be sampled in response to the shifted clock signal CLK indicating that the clock signal CLK may be used to recover the data DIN. The first synchronized signal 2NA serving as the output signal of the first synchronization unit 210 may correspond to the recovery data.

Generally, conventional CDR circuits employing conventional phase detectors such as the one illustrated in FIG. 2 require a relatively long time to position the rising edge of the clock signal CLK to the center of the data DIN. Hence, improvements are desirable.

SUMMARY

Various embodiments are directed to an improved dock generation circuit.

In an embodiment an integrated circuit may include: a phase detector suitable for generating a delay control signal by comparing the phases of first and second clock signals to first and second target positions; a variable delay unit suitable for shifting the first and second clock signals to the first and second target positions, respectively, in response to the delay control signal; and a position controller suitable for varying the first and second target positions according to an operation mode.

The phase detector may include: an alignment unit suitable for aligning data in response to the first and second dock signals; a first decoding unit suitable for generating a first control signal by decoding the data aligned by the alignment unit; a second decoding unit suitable for generating a second control signal by decoding the data aligned by the alignment unit; and a multiplexing unit suitable for outputting the first or second control signal as the delay control signal according to the operation mode.

The operation mode may include a first and second operation modes, during the first operation mode, the first target position corresponds to the center of the data and the second target position corresponds to an edge of the data, and during the second operation mode, the first target position corresponds to the edge of the data and the second target position corresponds to the center of the data.

The integrated circuit may further include an output unit suitable for outputting any one of the data aligned by the alignment unit as recovery data according to the operation mode.

In an embodiment an integrated circuit may include: a delay unit suitable for delaying input data by a predetermined time; a reset signal generator suitable for generating a reset signal in response to the input data and an output signal of the delay unit; an oscillator suitable for generating first and second clock signals in response to the reset signal; a phase detector suitable for generating a delay control signal by comparing the phases of the first and second clock signals to first and second target positions corresponding to the respective phases; a variable delay unit suitable for delaying the first dock signal to the first target position and delaying the second dock signal to the second target position, in response to the delay control signal; and a position controller suitable for changing the first and second target positions according to an operation mode.

The phase detector may include: an alignment unit suitable for aligning data in response to the first and second dock signals; a first decoding unit suitable for generating a first control signal by decoding the data aligned by the alignment unit; a second decoding unit suitable for generating a second control signal by decoding the data aligned by the alignment unit; and a multiplexing unit suitable for outputting the first or second control signal as the delay control signal according to the operation mode.

The operation mode may include first and second operation modes, during the first operation mode, the first target position corresponds to the center of the data and the second target position corresponds to an edge of the data, and during the second operation mode, the first target position corresponds to the edge of the data and the second target position corresponds to the center of the data.

The integrated circuit may further include an output unit suitable for outputting any one of the data aligned by the alignment unit as recovery data according to the operation mode.

The operation mode may have information corresponding to the frequency at which the data are inputted.

In an embodiment, an operating method of a dock data recovery circuit may include: selecting an operation mode according to the frequency of data; setting target positions of first and second dock signals in response to the operation mode, and performing a phase comparison according to the target positions; adjusting frequencies and delay s of the first and second clock signals according to the result of the performing of the phase comparison; and recovering the data in response to the first and second clock signals.

The performing of the phase comparison may include: aligning the data in response to the first and second clock signals; generating first and second control signals by decoding the aligned data; and outputting the first or second control signal as a delay control signal for adjusting the frequencies and delay s of the first and second signals according to the operation mode.

The recovering of the data may include: outputting first data synchronized with the first clock signal as recovery data according to the operation mode; and outputting second data synchronized with the second clock signal as the recovery data according to the operation mode.

The operation mode may include a first and second operation mode, during the first operation mode, the first target position corresponds to the center of the data and the second target position corresponds to an edge of the data and during the second operation mode, the first target position corresponds to the edge of the data and the second target position corresponds to the center of the data.

In an embodiment, a clock generation circuit may include a phase detector. The phase detector may vary a target position according to an operation mode.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete. Throughout the disclosure, like reference numerals refer to like parts throughout the various figures and embodiments of the present invention.

Figure 3:
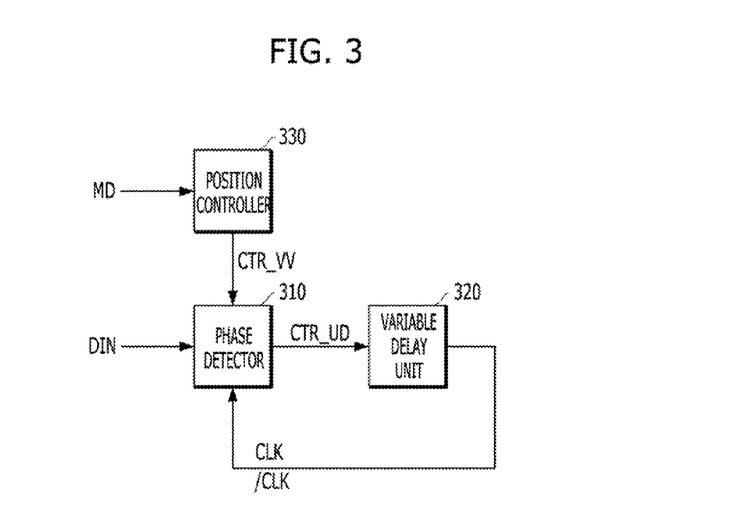
FIG. 3 is a block diagram illustrating a CDR circuit according to an embodiment of the present invention.

FIG. 3 is a block diagram illustrating a CDR circuit, according to an embodiment of the present invention.

Referring to FIG. 3, a CDR circuit may include a phase detector 310, a variable delay unit 320, and a position controller 330.

The phase detector 310 may generate an up or down control signal CTR_UD. For example, the phase detector 310 may generate an up or down control signal CTR_UD by comparing the phase of a dock signal CLK to the phase of a first target position and/or comparing the phase of a dock bar signal /CLK to the phase of a second target position. The first target position may indicate a phase to which the clock signal CLK is intended to be finally shifted. Likewise, the second target position may indicate a phase to which the clock bar signal /CLK is intended to be finally shifted. The first and second target positions will be described below in more detail with reference to FIGS. 4 and 5.

The variable delay unit 320 may adjust a shift change of the clock signal CLK and the clock bar signal /CLK in response to the up or down control signal CTR_UD. The variable delay unit 320 may increase or reduce a shift change. In an embodiment, the variable delay unit 320 may adjust a phase shift differential of the clock signal CLK and the clock bar signal /CLK in response to the up or down control signal CTR_UD. For example, the up or down control signal CTR_UD may serve as a control signal for adjusting a delay or an advancement phase shift of the clock signal CLK and the dock bar signal /CLK.

Figure 4:
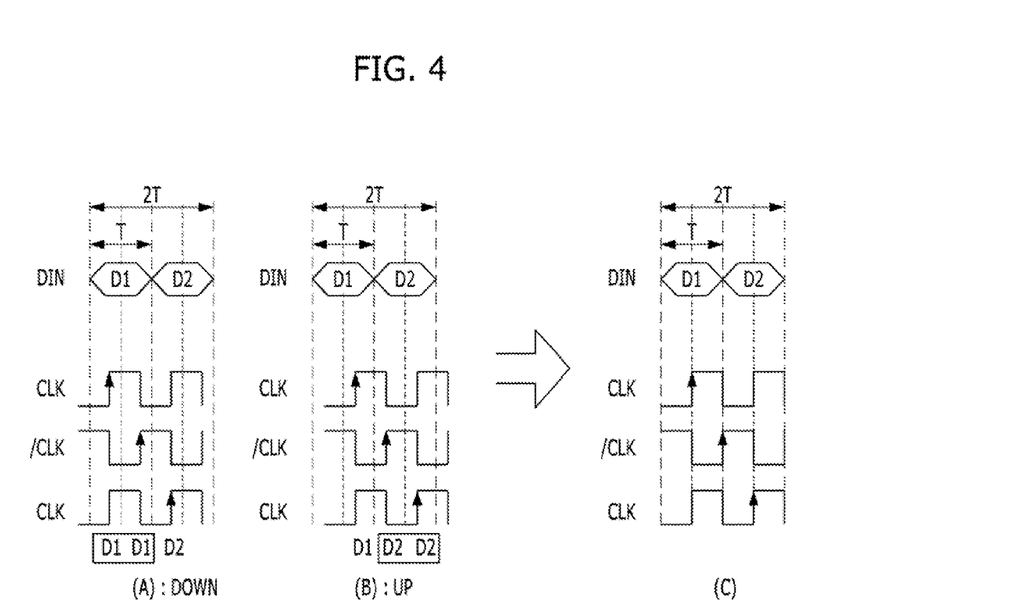
FIG. 4 is a diagram illustrating a first operation mode of a phase detector, according to an embodiment of the present invention.
Figure 5:
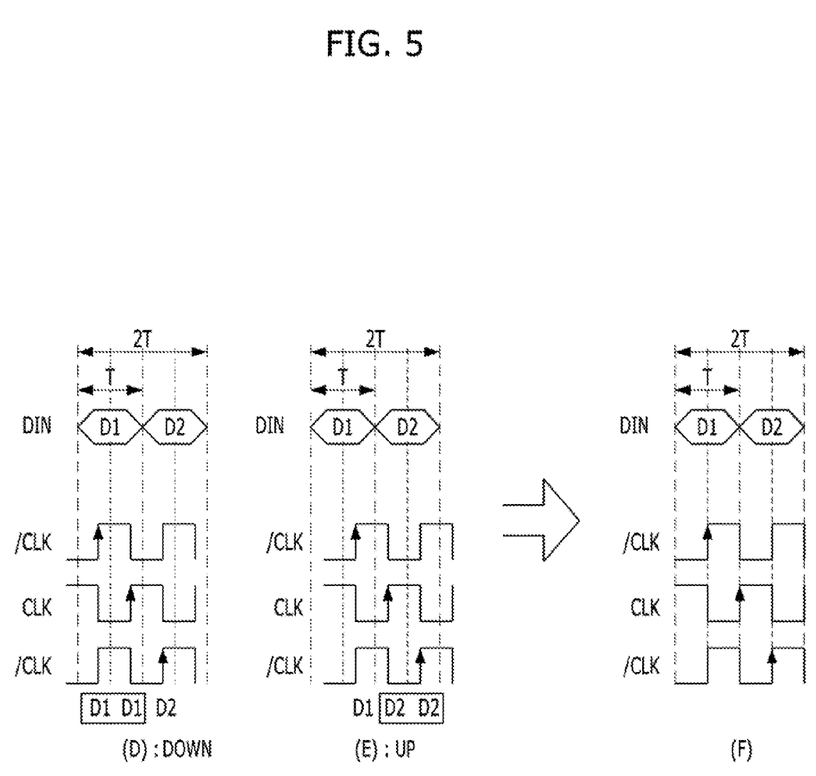
FIG. 5 is a diagram illustrating a second operation mode of a phase detector, according to an embodiment of the present invention.

The position controller 330 may generate a position control signal CTR_VV to be inputted to the phase detector 310 for changing the first and second target positions. The position controller 330 may generate the position control signal CTR_VV in response to an operation mode signal MD received from an external device as illustrated in the embodiment of FIG. 3. It is noted, however, that the invention is not limited in this way. For example, the operation mode signal MD may be generated by the position controller 330. Hereinafter, for convenience of description, we suppose that the operation mode signal MD may correspond to two operation modes. A first operation mode may be as illustrated in FIG. 4. A second operation mode may be as illustrated in FIG. 5. It is noted however, that the invention may not be limited in this way and other operation modes may be envisaged by those skilled in this art.

FIG. 4 is a diagram illustrating a first operation mode of a phase detector, according to an embodiment of the present invention.

Referring now to FIG. 4, reference symbol (A) represents a case in which the clock signal CLK may lead the center of data DIN, reference symbol (B) represents the case in which the clock signal CLK may lag behind the center of the data DIN, and reference symbol (C) represents final positions of the clock signal CLK and the clock signal bar CLK/having 180 degree phase difference with the clock signal CLK, both of which may be phase-shifted through a down operation based on case (A) or an up operation based on case (B).

In case (A), data D1 may be synchronized with a first rising edge of the dock signal CLK and/or with a rising edge of the clock bar signal /CLK. Data D2 may be synchronized with a second rising edge of the clock signal CLK. For example, the data D1, D1, and D2 may be synchronized in response to the clock signal CLK and the clock bar signal /CLK, and the phase detector 310 may generate the up or down control signal CTR_UD for the down operation. Then, the variable delay unit 320 of FIG. 3 may perform the down operation on the dock signal CLK and the dock bar signal /CLK in response to the up or down control signal CTR_UD. Thus, the phases of the dock signal CLK and the dock bar signal /CLK may be delayed from their current positions. Hence, the clock signal CLK and the clock bar signal /CLK may be shifted to the phases as illustrated in case (C).

In case (B), the data D1 may be synchronized with the first rising edge of the clock signal CLK. The data D2 may be synchronized with the rising edge of the clock bar signal /CLK and/or with the second rising edge of the clock signal CLK. For example, the data D1, D2, and D2 may be synchronized in response to the clock signal CLK and the clock bar signal /CLK, and the phase detector 310 may generate the up or down control signal CTR_UD for the up operation. Then the variable delay unit 320 of FIG. 3 may perform the up operation on the clock signal CLK and the clock bar signal /CLK in response to the up or down control signal CTR_UD. Thus, the phases of the clock signal CLK and the clock bar signal /CLK may be advanced from their current positions. Hence, the clock signal CLK and the clock bar signal /CLK may be shifted to phases as illustrated in case (C).

In case (C), the phase of the clock signal CLK may be aligned with the center of the data DIN. Also the phase of the clock bar signal /CLK may be aligned with an edge of the data DIN. Hereinafter, for convenience of description, the final position of the dock signal CLK may be referred to as the first target position, and the final position of the dock bar signal /CLK as the second target position. For example, the dock signal CLK may be shifted to the first target position corresponding to the center of the data DIN through the up or down operation, and the clock bar signal /CLK may be shifted to the second target position corresponding to the edge of the data DIN through the up or down operation.

The data DIN and the clock signal CLK may have a phase difference of one half cycle T of the clock signal CLK. In other words, the phase difference between the data DIN and the clock signal CLK may be set to ½T, for example, 180°.

Hence, the clock generation circuit may shift the clock signal CLK to a first target position and the clock bar signal /CLK to a second target position during a first operation mode.

FIG. 5 illustrates a second operation mode of a phase detector 310 according to an embodiment of the present invention. Referring now to FIG. 5, reference symbol (D) represents the case in which the clock bar signal /CLK may lead the center of the data DIN, reference symbol (E) represents the case in which the clock bar signal /CLK may lag behind the center of the data DIN and reference symbol (F) represents final positions of the clock signal CLK and the clock bar signal /CLK, both of which may be phase-shifted through a down or up operation based on cases (D) or (E), respectively.

In case (D), data D1 may be synchronized with a first rising edge of the dock bar signal /CLK and/or with a rising edge of the dock signal CLK. Data D2 may be synchronized with a second rising edge of the dock bar signal /CLK. For example, the data D1, D1, and D2 may be synchronized in response to the clock bar signal /CLK and the clock signal CLK, and the phase detector 310 may generate the up or down control signal CTR_UD for the down operation. Then, the variable delay unit 320 of FIG. 3 may perform the down operation on the clock signal CLK and the clock bar signal /CLK in response to the up or down control signal CTR_UD. Thus the phases of the clock signal CLK and the clock bar signal /CLK may be delayed from their current positions. Hence, the clock signal CLK and the clock bar signal /CLK may have phases as illustrated in case (F).

In case (E), the data D1 may be synchronized with the first rising edge of the dock bar signal /CLK. Data D2 may be synchronized with a rising edge of the clock signal CLK and/or with the second rising edge of the dock bar signal /CLK. For example, the data D1, D2 and D2 may be synchronized in response to the dock bar signal /CLK and the dock signal CLK, and the phase detector 310 may generate the up or down control signal CTR_UD for the up operation. Then, the variable delay unit 320 of FIG. 3 may perform the up operation on the clock signal CLK and the clock bar signal /CLK in response to the up or down control signal CTR_UD. Thus, the phases of the clock signal CLK and the clock bar signal /CLK may be advanced from their current positions. Hence the dock signal CLK and the dock bar signal /CLK may be shifted to phases as illustrated in case (F).

In case (F) the phase of the dock bar signal /CLK may be aligned with the center of the data DIN, and the phase of the clock signal CLK may be aligned with an edge of the data DIN. The clock bar signal /CLK may be shifted to the first target position corresponding to the center of the data DIN through the up or down operation, and the clock signal CLK may be shifted to the second target position corresponding to the edge of the data DIN through the up or down operation.

For example, the data DIN and the clock signal CLK may have a phase difference of one cycle T of the clock signal CLK. For example, the data DIN and the clock signal CLK may have no phase difference therebetween.

In an embodiment, the CDR circuit may shift the clock bar signal /CLK to a first target position and the dock signal CLK to a second target position, during a second operation mode.

The CDR circuit may control the phase detector 10 according to an operation mode. For example, the CDR circuit may adjust a phase difference between the clock signal CLK and the data DIN to 180° or 0°.

Figure 6:
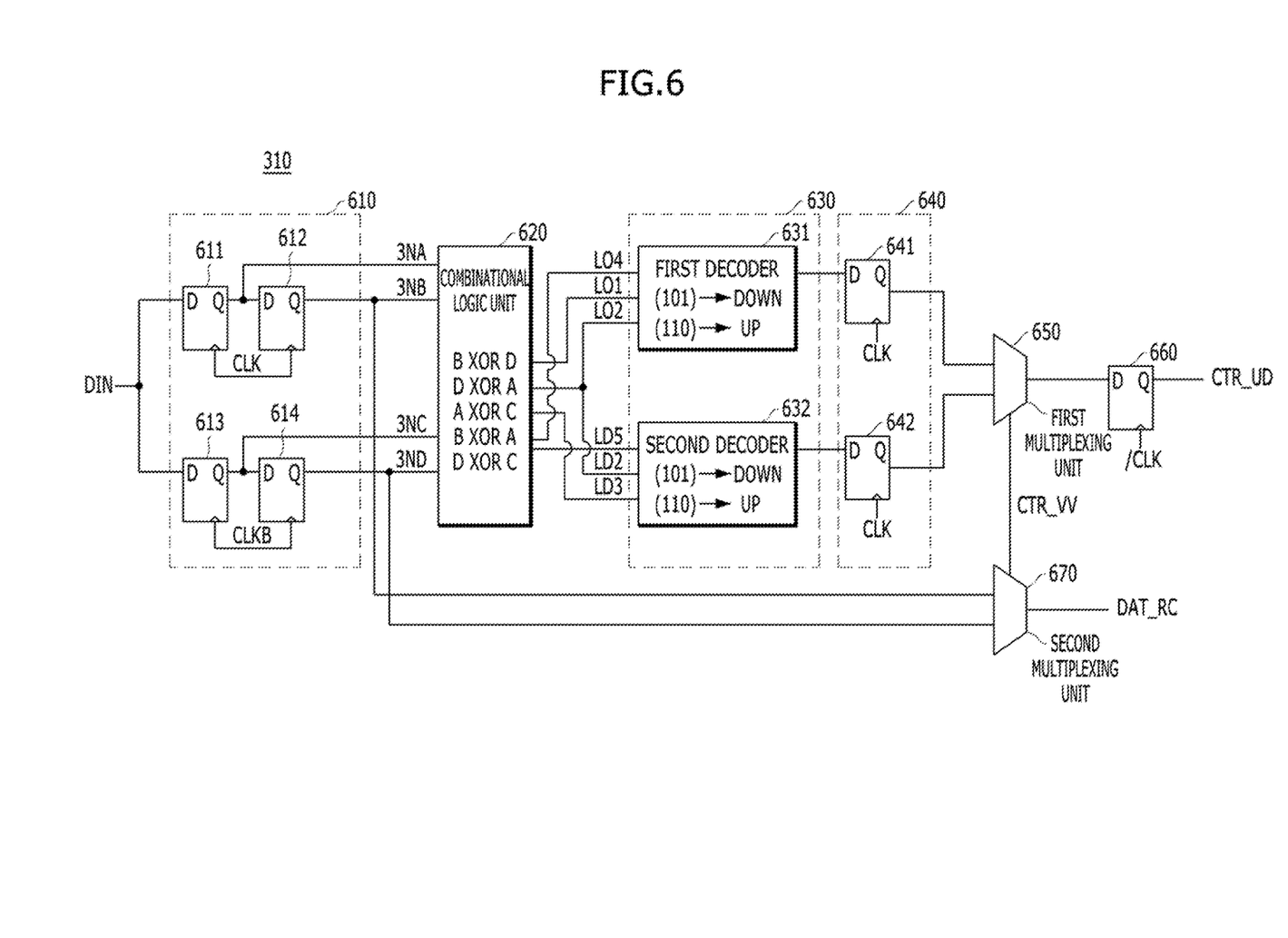
FIG. 6 is a block diagram illustrating a phase detector, according to an embodiment of the present invention.

FIG. 6 is a block diagram illustrating a phase detector, according to an embodiment of the present invention.

Re erring to FIG. 6, the phase detector 310 may include a data alignment unit 610, a combinational logic unit 620, a decoding unit 630, a synchronization unit 640, a first multiplexing unit 650, an output synchronization unit 660, and a second multiplexing unit 670.

The data alignment unit 610 may align the data DIN in response to the dock signal CLK and the clock bar signal /CLK. The data alignment unit 610 may include first to fourth synchronizers 611 to 614. The first and second synchronizers 611 and 612 may synchronize the data DIN in response to the clock signal CLK, and the third and fourth synchronizers 613 and 614 may synchronize the data DIN in response to the clock bar signal /CLK. The first synchronizer 611 may synchronize the data DIN with the clock signal CLK and output the synchronized data as a first synchronized signal 3NA. The second synchronizer 612 may synchronize the first synchronized signal 3NA with the clock signal CLK and output the synchronized data as a second synchronized signal 3NB. The third synchronizer 613 may synchronize the data DIN with the dock bar signal /CLK and output the synchronized data as a third synchronized signal 3NC. The fourth synchronizer 614 may synchronize the third synchronized signal 3NC with the clock bar signal /CLK and output the synchronized data as a fourth synchronized signal 3ND.

The combinational logic unit 620 may perform a logical operation on the first to fourth synchronized signals 3NA to 3ND to output first to fifth logic values LO1 to LO5. The combinational logic unit 620 may include a plurality of XOR gates XOR. For example the first synchronized signal 3NA may be replaced with A, the second synchronized signal 3NB may be replaced with B, the third synchronized signal 3NC may be replaced with C, and the fourth synchronized signal 3ND may be replaced with D. The first logic value LO1 may correspond to B XOR D, the second logic value LO2 may correspond to D XOR A, the third logic value LO3 may correspond to A XOR C, the logic value LO4 may correspond to B XOR A, and the fifth logic value LO5 may correspond to D XOR C, respectively.

The decoding unit 630 may decode the first to fifth logic values LO1 to LO5 to generate a source signal for the up or down control signal CTR_UD. The decoding unit 630 may include first and second decoders 631 and 632. For convenience of description, we suppose that the data D1 of the data DIN in FIGS. 4 and 5 may be logic high and the data D2 logic low.

The first decoder 631 may perform a decoding operation corresponding to the first operation mode. The first decoder 631 may generate the up or down control signal CIR_UD for the down operation when the fourth logic value LO4 is logic high, the first logic value LO1 is logic low, and the second logic value LO2 is logic high. Further, the first decoder 631 may generate the up or down control signal CTR_UD for the up operation when the fourth logic value LO4 is logic high, the first logic value LO1 is logic high, and the second logic value LO2 is logic low.

The second decoder 632 may perform a decoding operation corresponding to the second operation mode. The second decoder 632 may generate the up or down control signal CTR_UD for the down operation when the fifth logic value LO5 is logic high, the second logic value LO2 is logic low, and the third logic value LO3 is logic high. Further, the second decoder 632 may generate the up or down control signal CTR_UD for the up operation when the fifth logic value LO5 is logic high, the second logic value LO2 is logic high, and the third logic value LO3 is logic low.

The synchronization unit 640 may synchronize the output signals of the first and second decoders 631 and 632 with the clock signal CLK. The synchronization unit 640 may include first and second synchronizers 641 and 642. The first synchronizer 641 may synchronize the output signal of the first decoder 631 with the clock signal CLK The second synchronizer 642 may synchronize the output signal of the second decoder 632 with the clock signal CLK.

The first multiplexing unit 650 may selectively output any one of the output signals of the first and second synchronizers 641 and 642 in response to the control signal CTR_VV. The output synchronization unit 660 may synchronize the output signal of the first multiplexing unit 650 with the clock bar signal /CLK and output the synchronized signal as the up or down control signal CTR_UD.

The second multiplexing unit 670 may select the second or fourth synchronized signal 3NB or 3ND in response to the control signal CTR_VV to output the selected signal as recovery data DAT_RC. Thus, the dock signal CLK and the dock bar signal /CLK may be shifted to the position illustrated in case (C) of FIG. 4 through the up or down operation indicating that the data DIN may be sampled by synchronizing the data DIN with the clock signal CLK. Therefore, the second multiplexing unit 670 may then selectively output the second synchronized signal 3NB synchronized with the dock signal CLK, and the second synchronized signal 3NB may become the recovery data DAT_RC. Furthermore, the clock signal CLK and the clock bar signal /CLK may be shifted to the position illustrated in case (F) of FIG. 5, indicating that the data DIN may be sampled by synchronizing the data DIN with the clock bar signal /CLK. Therefore, the second multiplexing unit 670 may then selectively output the fourth synchronized signal 3ND synchronized with the clock bar signal /CLK, and the fourth synchronized signal 3ND may become the recovery data DAT_RC.

The CDR circuit may change the first and second target positions according to an operation mode. The CDR circuit may sample data according to target positions and output the sampled data as the recovery data DAT_RC.

Figure 7:
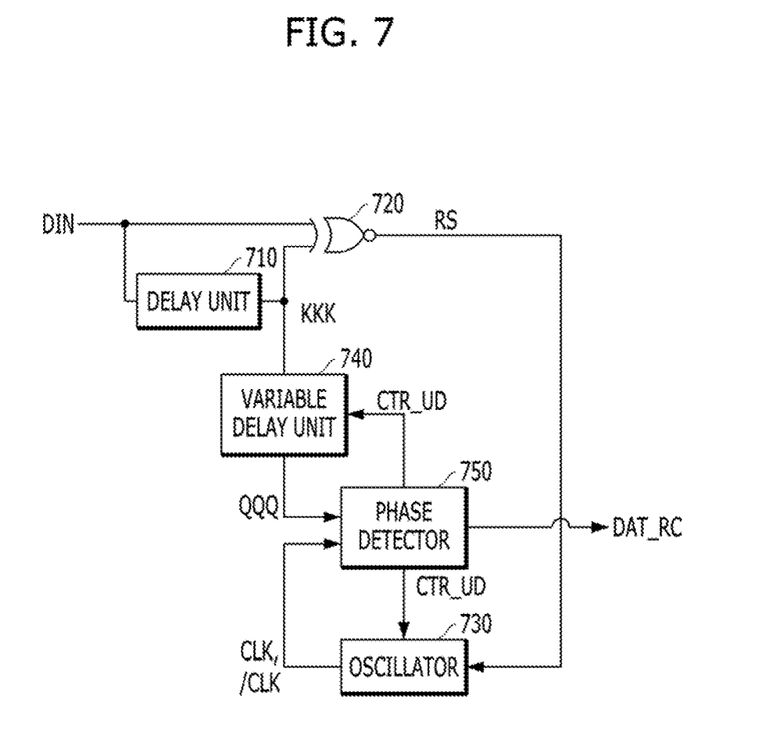
FIG. 7 is a block diagram illustrating a burst mode CDR circuit, according to an embodiment of the present invention.

FIG. 7 is a block diagram illustrating a burst mode CDR circuit, according to an embodiment of the present invention.

Referring to FIG. 7, a burst mode CDR circuit may include a delay unit 710, a reset signal generator 720, an oscillator 730, a variable delay unit 740 and a phase detector 750.

The delay unit 710 may delay data DIN by a preset time ΔT and output the delayed signal as a first delayed signal KKK. The reset signal generator 720 may perform an XNOR operation on the data DIN and the first delayed signal KKK to output a reset signal RS. The oscillator 730 may generate a clock signal CLK and a clock bar signal /CLK in response to the reset signal RS from the reset signal generator 720 and an up or down control signal CTR_UD from the phase detector 750. The variable delay unit 740 may generate a second delayed signal QQQ from the first delayed signal KKK under the control of the up or down control signal CTR_UD. The phase detector 750 may generate the up or down control signal CTR_UP and the recovery data DAT_RC using the second delayed signal QQQ, the clock signal CLK, and the clock bar signal /CLK.

Figure 8:
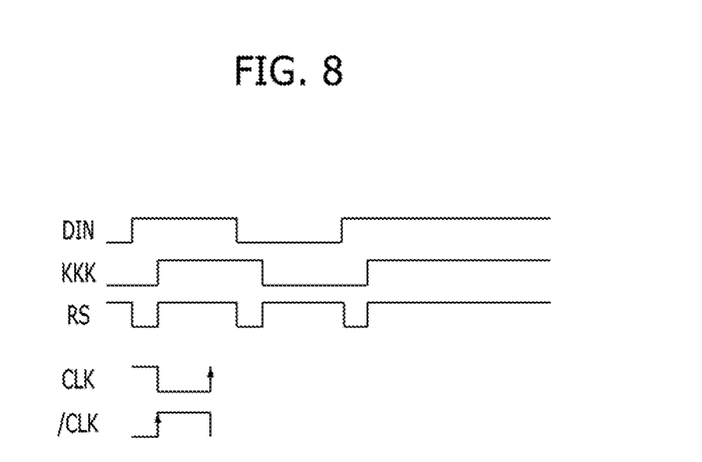
FIG. 8 is a timing diagram illustrating an operation of the burst mode CDR circuit, according to an embodiment of the present invention.

FIG. 8 is a timing diagram illustrating the operation of the burst mode CDR circuit according to an embodiment of the present invention, showing the data DIN, the first delayed signal KKK, the reset signal RS, the clock signal CLK and the dock bar signal /CLK.

First, the burst mode CDR circuit may generate the first delayed signal KKK by delaying the data DIN by the preset time ΔT. Then, the burst mode CDR circuit may perform an XNOR operation on the data DIN and the first delayed signal KKK to generate the reset signal RS. The reset signal RS may be considered as a signal obtained when the data DIN transits from logic low to logic high or from logic high to logic low. The oscillator 730 may generate the clock signal CLK and the clock bar signal /CLK in response to the reset signal RS. As illustrated in FIG. 8, the rising edge of the dock signal CLK may be already positioned around the center of the first delayed signal KKK corresponding to the data DIN, and the rising edge of the clock bar signal /CLK may also be already positioned around an edge of the first delayed signal KKK. Thus, the burst mode CDR circuit may perform a phase-locking more quickly. The phase-locking may indicate that the shifting of the clock signal CLK and the clock bar signal /CLK was completed.

For example, when the first delayed signal KKK is slightly remote from its center, the phase detector 750 may detect a phase of the first delayed signal KKK and generate the up or down control signal CTR_UD, and the oscillator 730 and the variable delay unit 740 may perform a phase-locking operation in response to the up or down control signal CTR_UD.

Referring back to FIG. 7, the burst mode CDR circuit may include two delay circuits on the transmission path of the data DIN, for example, the delay unit 710 and the variable delay unit 740. The data DIN may include various logic values mixed therein indicating that the data DIN has various frequency components. Thus, when the data DIN is delayed, a jitter characteristic of the delayed signal may be degraded as much. Furthermore, a power consumption of the delay circuits may be increased to degrade the total power consumption of the semiconductor device.

Figure 9:
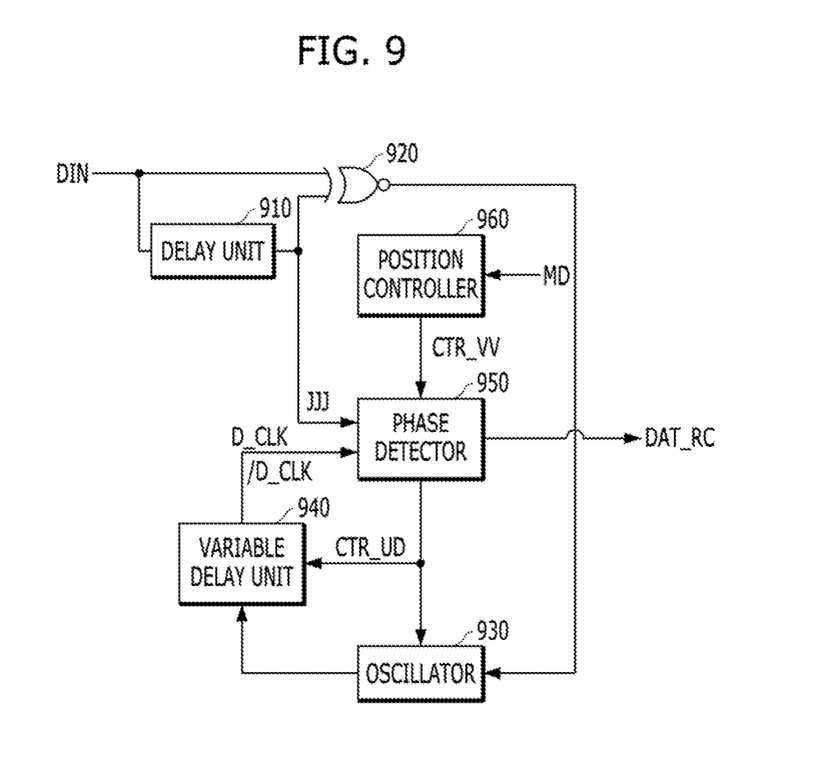
FIG. 9 is a block diagram illustrating a CDR circuit, according to another embodiment of the present invention.

FIG. 9 is a block diagram for illustrating a CDR circuit according to another embodiment of the present invention.

Referring to FIG. 9, the CDR circuit may include a delay unit 910, a reset signal generator 920, an oscillator 930, a variable delay unit 940, a phase detector 950, and a position controller.

The delay unit 910 may generate a delayed signal JJJ by delaying data DIN by a predetermined time ΔT. The reset signal generator 920 may perform an XNOR operation on the data DIN and the delayed signal JJJ to output a reset signal RS. The oscillator 930 may generate a clock signal CLK and a clock bar signal /CLK in response to the reset signal RS and an up or down control signal CTR_UD. The variable delay unit 940 may generate a delayed clock signal D_CLK and a delayed clock bar signal /D_CLK from the clock signal CLK and the clock bar signal /CLK under the control of the up or down control signal CTR_UD, wherein the delayed clock signal D_CLK and delayed clock bar signal /D_CLK correspond to first and second target positions respectively. The phase detector 950 may generate the up or down control signal CTR_UP and recovery data DAT_RC using the delayed data signal JJJ, the delayed clock signal D_CLK, and the delayed clock bar signal /D_CLK The position controller 960 may generate a position control signal CTR_VV for changing the first and second target positions in response to an operation mode signal MI/The generated position control signal CTR_VV may be inputted to the phase detector 950.

Briefly, the oscillator 930 and the variable delay unit 940 may be controlled by the up or down control signal CTR_UD The oscillator 930 may control the frequencies of the clock signal CLK and the clock bar signal /CLK. The variable delay unit 940 may control the delay of the clock signal CLK and the clock bar signal /CLK.

The CDR circuit according to an embodiment of the present invention may include the variable delay unit 940 formed on the path through which the clock signal CLK and the clock bar signal /CLK are transmitted. The variable delay unit 940 may perform a phase-locking operation by delaying the clock signal CLK and the clock bar signal /CLK. Since the frequencies for the clock signal CLK and the clock bar signal /CLK may be fixed, the jitter characteristic thereof may not be degraded even though the delay circuits are used to perform a delay operation. Thus, the power consumption may also be reduced.

FIGS. 10 to 13 are diagrams illustrating an operation of the variable delay unit 940 of a CDR circuit according to another embodiment of the present invention.

Figure 10:
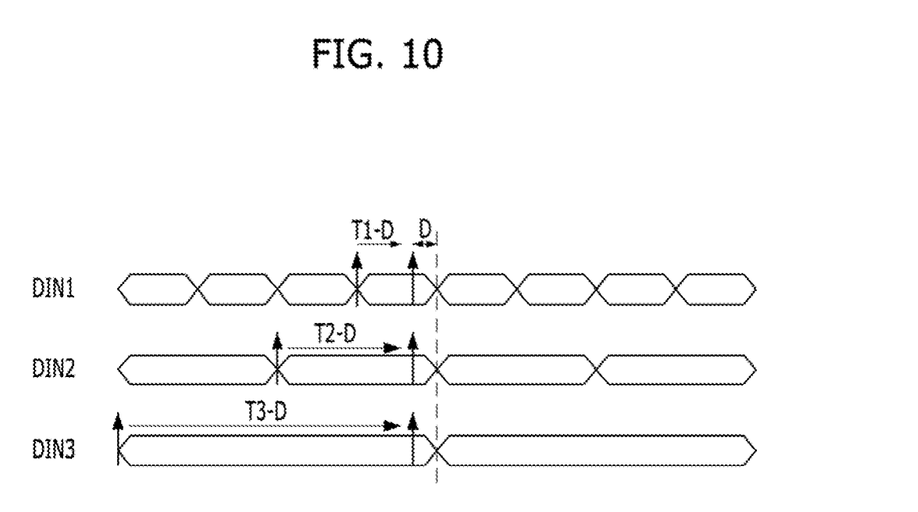
FIGS. 10 to 13 are diagrams for illustrating an operation of a variable delay unit of a CDR circuit, according to an embodiment of the present invention.

Referring to FIG. 10, first the delayed data signal JJJ and the delayed clock signal D_CLK which are transmitted to the variable delay unit 940 are described. The delayed data signal JJJ and the delayed clock signal D_CLK may be generated based on the data DIN. For example, the delayed data signal JJJ may be generated as the data DIN are passed through the delay unit 910, and the delayed dock signal D_CLK may be generated as the data DIN are passed through the reset signal generator 920, the oscillator 930, and the variable delay unit 940. A path for generating the delayed clock signal D_CLK (hereinafter, referred to as a clock path) is longer than a path for generating the delayed data signal JJJ (hereinafter, referred to as a data path). Considering that the phase detector 950 may operate to adjust the phases of the delayed data signal JJJ and the delayed clock signal D_CLK to be the same phase therebetween, the delayed data signal JJJ may lead the delayed clock signal D_CLK before the phase-locking operation. In FIG. 10, symbol D represents a delay caused by the path.

FIG. 10 illustrates first to third data DIN1 to DIN3 having different frequencies. As described above, the phases of the delayed data signal JJJ and the delayed clock signal D_CLK may be distorted by the delay D. Thus in order to adjust the phases of the data signal JJJ and the delayed clock signal D_CLK to become the same, the variable delay unit 940 may delay the delayed clock signal D_CLK. In this case, the variable delay unit 940 may secure a delay corresponding to T1-D for the first data DIN1, secure a delay corresponding to T2-D for the second data DIN2, and secure a delay corresponding to T3-D for the third data DIN3.

Figure 11:
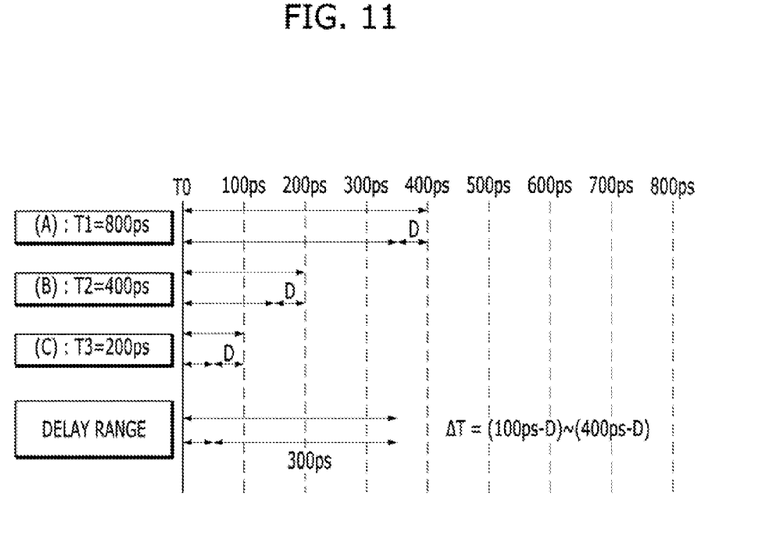

FIG. 11, illustrates specific examples, wherein reference symbol (A) represents the case in which the data DIN have a cycle of 800 ps (T1=800 ps) reference symbol (B) represents the case in which the data DIN have a cycle of 400 ps (T2=400 ps), and reference symbol (C) represents the case in which the data DIN have a cycle of 200 ps (T3=200 ps). As illustrated in FIG. 11, the delay which may need to be secured by the variable delay unit 940 may correspond to a value obtained by subtracting D from one half of the corresponding frequency. In order to satisfy all of cases (A), (B), and (C), the variable delay unit 940 may need to secure a delay range ΔT of 300 ps. FIG. 11 illustrates the case in which the phase detector 950 may maintain only the first operation mode.

Figure 12:
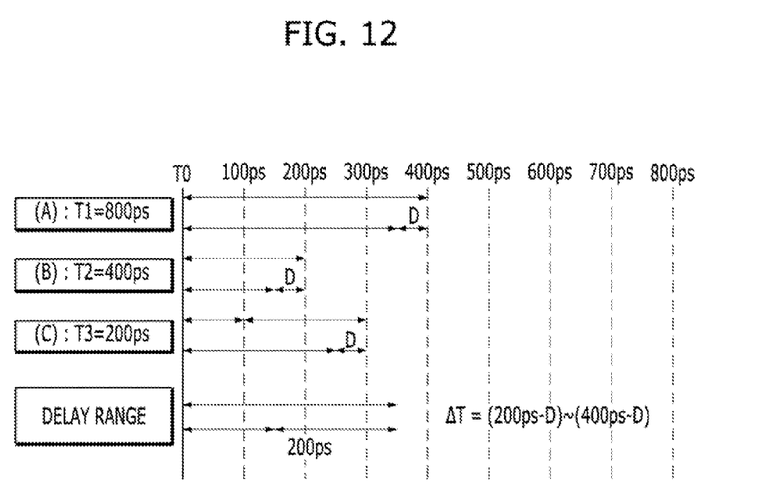

FIG. 12 illustrates the case in which the phase detector 950 maintains only the first operation mode as in the case of FIG. 11. In case (C), a delay corresponding to one cycle is added. Hence the variable delay unit 940 may need to secure a delay range ΔT of 200 ps.

Figure 13:
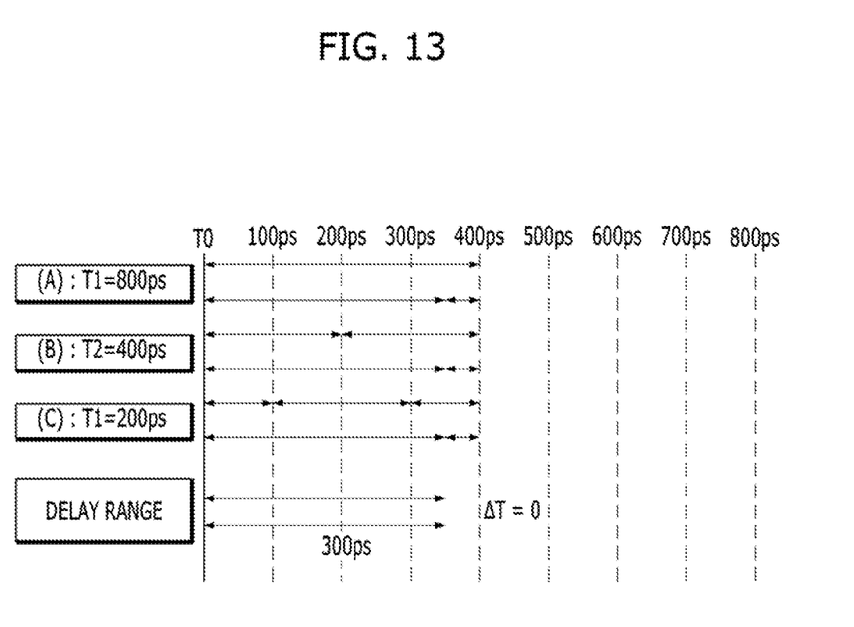

FIG. 13 illustrates the case in which the phase detector 950 of FIG. 9 maintains both of the first operation mode and the second operation mode.

In case (A), the phase detector 950 may operate in the first operation mode. Thus, the variable delay unit 940 may have a delay corresponding to a value obtained by subtracting D from one half of 800 ps which is the cycle of the DIN. In case (B) the phase detector 950 may operate in the second operation mode. Thus, the variable delay unit 940 may have a delay corresponding to a value obtained by subtracting D from 400 ps which is the cycle of the data DIN. In case (C), the phase detector 950 may operate in the second operation mode. Thus, the variable delay unit 940 may have a delay corresponding to a value obtained by subtracting 0 from 400 ps which is two cycles of the data DIN. Since cases A to C have the same delay as illustrated in FIG. 13 the variable delay unit 940 may need to secure a delay range ΔT of 0 ps.

Referring now to FIGS. 9 and 13, a CDR circuit configuration will be described.

First, the CDR circuit may generate the operation mode signal MD according to the frequency at which the data DIN are inputted. Thus, when the data DIN have the frequency indicated by reference symbol (A) of FIG. 13, the phase detector 950 may operate in the first operation mode in response to the operation mode signal MD. Thus, the delayed clock signal D_CLK and the delayed clock bar signal /D_CLK may be shifted to the first target position and the second target position, respectively. Furthermore, when the data DIN have the frequency indicated by reference symbol (B) of FIG. 13 the phase detector 950 may operate in the second operation mode n response to the operation mode signal MD. Thus, the delayed clock signal D_CLK and the delayed clock bar signal /D_CLK may be shifted to the second and first target positions, respectively. Such an operation may be performed because the phase detector 950 may control the phases of the delayed data signal JJJ and the delayed clock signal D_CLK to 180° or 0° according to the operation mode signal MD. Through the operation of the phase detector 950, the variable delay unit 940 may be designed to have a delay range of almost zero.

Hence, the CDR circuit, according to an embodiment of the present invention may control the target positions according to the operation mode, and delay a dock component by the minimum delay range. By delaying a dock component more favorable jitter characteristics may be obtained than when a data component is delayed.

In accordance with the embodiment of the present invention, the phase detector may selectively operate according to an operation mode. Thus, the operation efficiency of the CDR circuit may be maximized.

Although various embodiments have been described for illustrative purposes, it will be apparent to those skilled in the art that various changes and modifications may be made without departing from the spirit and scope of the invention as defined in the following claims.

For example, the positions and types of the logic gates and transistors used in the above-described embodiments may be set in different manners according to the polarities of input signals.

What is claimed is:
1. An integrated circuit comprising:
   a phase detector configured to generate a delay control signal by comparing the phases of first and second clock signals to first and second target positions;

a variable delay unit configured to shift the first and second clock signals to the first and second target positions, respectively, in response to the delay control signal; and a position controller configured to vary the first and second target positions according to an operation mode, wherein the operation mode comprises a first and second operation modes, during the first operation mode, the first target position corresponds to the center of the data and the second target position corresponds to an edge of the data, and during the second operation mode, the first target position corresponds to the edge of the data and the second target position corresponds to the center of the data.

2. The integrated circuit of claim 1, wherein the phase detector comprises:

an alignment unit configured to align data in response to the first and second clock signals;

a first decoding unit configured to generate a first control signal by decoding the data aligned by the alignment unit;

a second decoding unit configured to generate a second control signal by decoding the data aligned by the alignment unit; and a multiplexing unit configured to output the first or second control signal as the delay control signal according to the operation mode.

3. The integrated circuit of claim 2, further comprising an output unit configured to output any one of the data aligned by the alignment unit as recovery data according to the operation mode.

4. An integrated circuit comprising:

a delay unit configured to delay input data by a predetermined time;

a reset signal generator configured to generate a reset signal in response to the input data and an output signal of the delay unit;

an oscillator configured to generate first and second clock signals in response to the reset signal;

a phase detector configured to generate a delay control signal by comparing the phases of the first and second clock signals to first and second target positions corresponding to the respective phases;

a variable delay unit configured to delay the first clock signal to the first target position and delay the second clock signal to the second target position, in response to the delay control signal; and a position controller configured to change the first and second target positions according to an operation mode, wherein the phase detector comprises:

an alignment unit configured to align data in response to the first and second clock signals;

a first decoding unit configured to generate a first control signal by decoding the data aligned by the alignment unit;

a second decoding unit configured to generate a second control signal by decoding the data aligned by the alignment unit; and a multiplexing unit configured to output the first or second control signal as the delay control signal according to the operation mode.

5. The integrated circuit of claim 4, wherein the operation mode comprises first and second operation modes, during the first operation mode, the first target position corresponds to the center of the data and the second target position corresponds to an edge of the data, and during the second operation mode, the first target position corresponds to the edge of the data and the second target position corresponds to the center of the data.

6. The integrated circuit of claim 4, further comprising an output unit configured to output any one of the data aligned by the alignment unit as recovery data according to the operation mode.

7. The integrated circuit of claim 4, wherein the operation mode has information corresponding to the frequency at which the data are inputted.

8. An operating method of a clock data recovery circuit, comprising:

selecting an operation mode according to the frequency of data;

setting a first target position and a second target position of first and second clock signals in response to the operation mode, and performing a phase comparison according to the target positions;

adjusting frequencies and delay s of the first and second clock signals according to the result of the performing of the phase comparison; and recovering the data in response to the first and second clock signals, wherein the performing of the phase comparison comprises:

aligning the data in response to the first and second clock signals;

generating first and second control signals by decoding the aligned data; and outputting the first or second control signal as a delay control signal for adjusting the frequencies and delay s of the first and second signals, according to the operation mode.

9. The operating method of claim 8, wherein the recovering of the data comprises:

outputting first data synchronized with the first clock signal as recovery data according to the operation mode; and outputting second data synchronized with the second clock signal as the recovery data according to the operation mode.

10. The operating method of claim 8, wherein the operation mode comprises a first and second operation mode, during the first operation mode, the first target position corresponds to the center of the data and the second target position corresponds to an edge of the data, and during the second operation mode, the first target position corresponds to the edge of the data and the second target position corresponds to the center of the data.

* * * * *